(12) United States Patent
Sakakibara

(10) Patent No.: US 10,269,753 B2
(45) Date of Patent: Apr. 23, 2019

(54) SEMICONDUCTOR DEVICE AND MANUFACTURING METHOD OF SEMICONDUCTOR DEVICE

(71) Applicant: TOYOTA JIDOSHA KABUSHIKI KAISHA, Toyota-shi, Aichi-ken (JP)

(72) Inventor: Akinori Sakakibara, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/847,083

(22) Filed: Dec. 19, 2017

(65) Prior Publication Data
US 2018/0197833 A1 Jul. 12, 2018

(30) Foreign Application Priority Data

Jan. 10, 2017 (JP) .................... 2017-001924

(51) Int. Cl.
*H01L 23/488* (2006.01)
*H01L 23/00* (2006.01)
(Continued)

(52) U.S. Cl.
CPC .......... *H01L 24/32* (2013.01); *H01L 21/4875* (2013.01); *H01L 23/492* (2013.01); *H01L 24/29* (2013.01); *H01L 24/83* (2013.01); *H01L 2224/26175* (2013.01); *H01L 2224/293* (2013.01); *H01L 2224/29007* (2013.01); *H01L 2224/29294* (2013.01); *H01L 2224/3201* (2013.01); *H01L 2224/32013* (2013.01); *H01L 2224/32058* (2013.01); *H01L 2224/32245* (2013.01); *H01L 2224/32257* (2013.01); *H01L 2224/7531* (2013.01); *H01L 2224/75705* (2013.01); *H01L 2224/75756* (2013.01);
(Continued)

(58) Field of Classification Search
CPC ... H01L 23/492; H01L 23/4924; H01L 24/02; H01L 24/05; H01L 24/06; H01L 24/07; H01L 24/20; H01L 24/29; H01L 24/32; H01L 24/34
See application file for complete search history.

(56) References Cited

U.S. PATENT DOCUMENTS

| 2008/0156398 A1* | 7/2008 | Yasuda | ................... H01L 24/29 148/23 |
| 2010/0025847 A1* | 2/2010 | Tomura | ................... H01L 24/32 257/737 |
| 2016/0111395 A1 | 4/2016 | Heinrich | |

FOREIGN PATENT DOCUMENTS

| JP | 2014-013855 A | 1/2014 |
| JP | 2014-029897 A | 2/2014 |

(Continued)

*Primary Examiner* — Cuong Q Nguyen
(74) *Attorney, Agent, or Firm* — Oliff PLC

(57) ABSTRACT

The manufacturing method of a semiconductor device includes applying a conductive paste containing metal particles to a specified area in an electrode plate including a recess in a surface of the electrode plate, the specified area being adjacent to the recess. The manufacturing method of a semiconductor device includes placing a semiconductor chip on the conductive paste so that an outer peripheral edge of the semiconductor chip is located above the recess. The manufacturing method of a semiconductor device includes hardening the conductive paste by heating the conductive paste while applying pressure to the semiconductor chip in a direction toward the electrode plate.

4 Claims, 4 Drawing Sheets

(51) Int. Cl.
*H01L 21/48* (2006.01)
*H01L 23/492* (2006.01)
(52) U.S. Cl.
CPC .............. *H01L 2224/83001* (2013.01); *H01L 2224/8384* (2013.01); *H01L 2224/83192* (2013.01); *H01L 2224/83203* (2013.01); *H01L 2224/83385* (2013.01); *H01L 2924/351* (2013.01); *H01L 2924/3512* (2013.01)

(56) References Cited

FOREIGN PATENT DOCUMENTS

| | | |
|---|---|---|
| JP | 2015-082614 A | 4/2015 |
| JP | 2015-153966 A | 8/2015 |
| JP | 2016-115865 A | 6/2016 |
| WO | 2015/060346 A1 | 4/2015 |

* cited by examiner

SEMICONDUCTOR DEVICE AND MANUFACTURING METHOD OF SEMICONDUCTOR DEVICE

INCORPORATION BY REFERENCE

The disclosure of Japanese Patent Application No. 2017-001924 filed on Jan. 10, 2017 including the specification, drawings and abstract is incorporated herein by reference in its entirety.

BACKGROUND

1. Technical Field

A technique to be disclosed by the present specification relates to a semiconductor device and a manufacturing method of a semiconductor device.

2. Description of Related Art

Japanese Patent Application Publication No. 2016-115865 discloses a technique for joining together a semiconductor chip and an electrode plate. In this technique, a conductive paste containing metal particles is applied to a surface of an electrode plate, and a semiconductor chip is placed on this conductive paste. Thereafter, the conductive paste is hardened by heating the conductive paste while applying pressure to the semiconductor chip in a direction toward the electrode plate. Thus, the semiconductor chip and the electrode plate are joined together by a joining layer that is produced as the conductive paste hardens.

SUMMARY

To join together a semiconductor chip and an electrode plate by a conductive paste, it is necessary to heat the conductive paste while applying pressure to the conductive paste between the semiconductor chip and the electrode plate. When the conductive paste is heated and hardened, the joining layer is joined to the semiconductor chip and the electrode plate. Thereafter, when the semiconductor chip, the joining layer, and the electrode plate are returned to room temperature, these components shrink as the temperature decreases. During this process, high thermal stress acts on the semiconductor chip due to a difference in the coefficient of linear expansion between the semiconductor chip and the joining layer. In particular, high thermal stress acts on the vicinity of an outer peripheral edge of the semiconductor chip. This thermal stress acting on the semiconductor chip affects the reliability of the semiconductor chip. The present disclosure provides a technique for reducing the thermal stress acting on the vicinity of the outer peripheral edge of a semiconductor chip while an electrode plate and the semiconductor chip are joined together by a conductive paste.

A first aspect of the present disclosure is a manufacturing method of a semiconductor device. The manufacturing method of a semiconductor device includes applying a conductive paste containing metal particles to a specified area in an electrode plate including a recess in a surface of the electrode plate, the specified area being adjacent to the recess. The manufacturing method of a semiconductor device includes placing a semiconductor chip on the conductive paste so that an outer peripheral edge of the semiconductor chip is located above the recess. The manufacturing method of a semiconductor device includes hardening the conductive paste by heating the conductive paste while applying pressure to the semiconductor chip in a direction toward the electrode plate.

When pressure is applied to the semiconductor chip in the direction toward the electrode plate in the hardening step, a part of the conductive paste squeezed between the semiconductor chip and the electrode plate flows out toward the recess. The conductive paste having flowed out comes in contact with a part of the semiconductor chip in the vicinity of the outer peripheral edge and with an inner surface of the recess. When heated and hardened, the conductive paste forms a joining layer in which metal particles are joined with one another. The conductive paste between the specified area and the semiconductor chip hardens under high pressure. Thus, the conductive paste between the specified area and the semiconductor chip hardens and forms a low-porosity joining layer. The specified area and the semiconductor chip are firmly joined together by this low-porosity joining layer. On the other hand, such high pressure is not applied to the conductive paste between the recess and the semiconductor chip. Thus, the conductive paste between the recess and the semiconductor chip hardens and forms a high-porosity joining layer. The recess and the semiconductor chip are joined together by this high-porosity joining layer. When the semiconductor chip, the joining layer, and the electrode plate are returned to room temperature after hardening of the conductive paste, thermal stress acts on the semiconductor chip. As described above, the part of the joining layer that is joined to the vicinity of the outer peripheral edge of the semiconductor chip has a high porosity. Therefore, this part of the joining layer is likely to deform according to the thermal stress. Thus, the thermal stress occurring in the vicinity of the outer peripheral edge of the semiconductor chip is relieved. As has been described above, according to this manufacturing method, the thermal stress occurring in the vicinity of the outer peripheral edge of the semiconductor chip can be reduced.

In the above aspect, the conductive paste may not be applied to a bottom surface of the recess in the step of applying the conductive paste, and the conductive paste having flowed from the specified area into the recess may come in contact with the bottom surface of the recess in the step of hardening the conductive paste.

According to this aspect, a surface of a part of the joining layer that is adjacent to the outer peripheral edge of the semiconductor chip assumes a shape inclined relative to a lower surface of the semiconductor chip so as to shift toward the bottom surface of the recess while extending away from the specified area. Thus, cracks are less likely to occur in the joining layer.

In the above aspect, a jig may be disposed at a position above the recess and close to the outer peripheral edge of the semiconductor chip.

According to this aspect, the conductive paste can be kept from swelling upward.

A second aspect of the present disclosure relates to a semiconductor device. The semiconductor device includes an electrode plate including a recess and a specified area adjacent to the recess, the recess being in a surface of the electrode plate. The semiconductor device includes a joining layer that is composed of metal and that covers an area extending from the specified area to the recess. The semiconductor device includes a semiconductor chip being disposed so as to face the specified area and the recess, the semiconductor chip being joined to the joining layer above the specified area and the recess, and an outer peripheral edge of the semiconductor chip being located above the recess A porosity of the joining layer in the recess is higher than a porosity of the joining layer in the specified area.

According to this aspect, the joining layer that joins together the outer peripheral edge of the semiconductor chip and the recess of the electrode plate has a high porosity, so that the thermal stress acting on the outer peripheral edge of the semiconductor chip can be suppressed.

In the above aspect, a surface of a part of the joining layer that is adjacent to the outer peripheral edge of the semiconductor chip may be inclined relative to a lower surface of the semiconductor chip so as to shift toward a bottom surface of the recess while extending away from the specified area.

According to this aspect, cracks are less likely to occur in the joining layer.

In the above aspect, the joining layer may be a conductive paste.

In the above aspect, the recess may extend in an annular shape in the surface of the electrode plate so as to surround the semiconductor chip, and the specified area may be an area surrounded by the recess.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
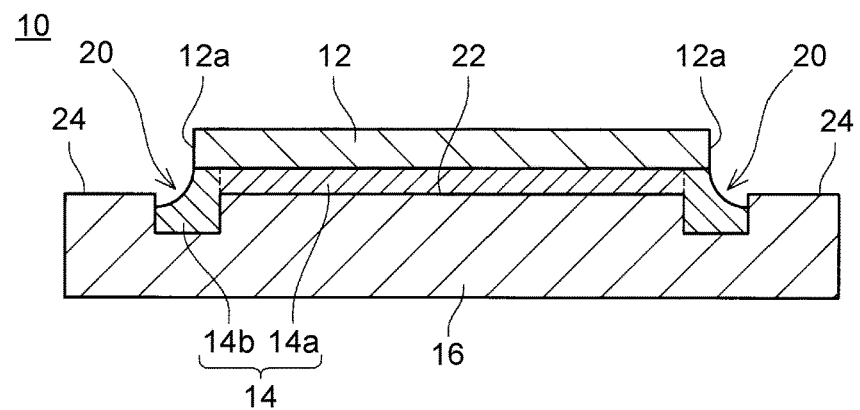
FIG. 1 is a vertical sectional view of a semiconductor device 10.

As shown in FIG. 1, a semiconductor device 10 of an embodiment has a semiconductor chip 12, a joining layer 14, and an electrode plate 16. The semiconductor device 10 includes wiring members other than the joining layer 14 and the electrode plate 16 (e.g., other electrode plates and bonding wires), but these are not shown in FIG. 1.

The electrode plate 16 is a conductive plate composed of metal. A recess 20 is provided in an upper surface of the electrode plate 16. The recess 20 is a groove extending in an annular shape in the upper surface of the electrode plate 16. The upper surface of the electrode plate 16 is divided by the recess 20 into a central part 22 and an outer peripheral part 24. The central part 22 is a part surrounded by the recess 20.

The outer peripheral part 24 is a part located further on an outer peripheral side than the recess 20.

The semiconductor chip 12 includes a semiconductor substrate, and an electrode, an insulating layer, etc. provided on a surface of the semiconductor substrate. Although this is not shown, a lower surface of the semiconductor chip 12 is covered with an electrode. The semiconductor chip 12 is disposed on the electrode plate 16. An outer peripheral edge 12a of the semiconductor chip 12 is located above the recess 20. Thus, the semiconductor chip 12 is disposed on the electrode plate 16 so that the entire outer peripheral edge 12a overlaps the recess 20 when the semiconductor chip 12 and the electrode plate 16 are seen in a plan view along a stacking direction thereof.

Figure 2:
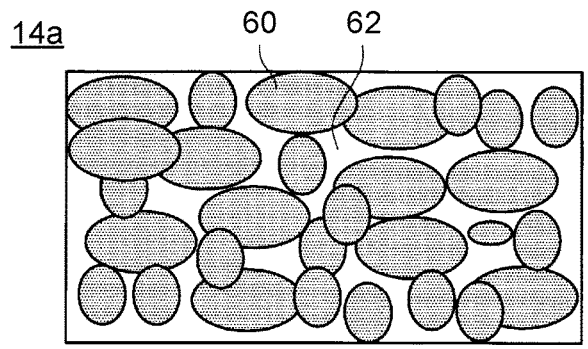
FIG. 2 is a sectional view of a first part 14a of a joining layer 14.
Figure 3:
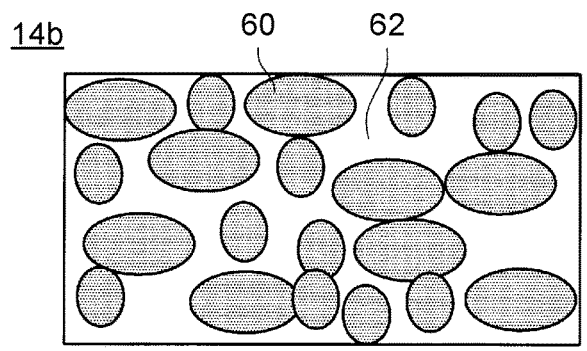
FIG. 3 is a sectional view of a second part 14b of the joining layer 14.

The joining layer 14 is disposed between the electrode plate 16 and the semiconductor chip 12. The joining layer 14 is joined to both the electrode plate 16 and the semiconductor chip 12 (more specifically, the electrode constituting the lower surface of the semiconductor chip 12). The electrode plate 16 and the semiconductor chip 12 are electrically connected to each other by the joining layer 14. The joining layer 14 is joined to the central part 22 of the electrode plate 16 and an inner surface of the recess 20, and is not in contact with the outer peripheral part 24. The joining layer 14 is joined to the entire area of the lower surface of the semiconductor chip 12. The joining layer 14 is exposed above the recess 20, between the semiconductor chip 12 and the electrode plate 16. An exposed surface of the joining layer 14 is inclined relative to the lower surface of the semiconductor chip 12. The exposed surface of the joining layer 14 shifts toward a bottom surface of the recess 20 while extending from the outer peripheral edge 12a of the semiconductor chip 12 toward the outer peripheral part 24 (i.e., while extending away from the central part 22). FIGS. 2 and 3 schematically show cross-sections of the joining layer 14. As shown in FIGS. 2 and 3, the joining layer 14 has a structure in which metal particles 60 are connected to one another. There is void 62 among the metal particles 60. The joining layer 14 has a first part 14a and a second part 14b. FIG. 2 shows a cross-section of the first part 14a at a predetermined position, and FIG. 3 shows a cross-section of the second part 14b at a predetermined position. The term porosity refers to a ratio of the void 62 per unit volume. A high porosity means a low ratio of the metal particles 60 per unit volume (i.e., a low density of the metal particles 60). The porosity increases from the first part 14a toward the second part 14b. Thus, an average porosity of the first part 14a is lower than an average porosity of the second part 14b. The high-porosity second part 14b is more likely to undergo elastic deformation than the low-porosity first part 14a. As shown in FIG. 1, the first part 14a is disposed between the central part 22 of the electrode plate 16 and the semiconductor chip 12, while the second part 14b is disposed between the recess 20 of the electrode plate 16 and the semiconductor chip 12.

Figure 4:
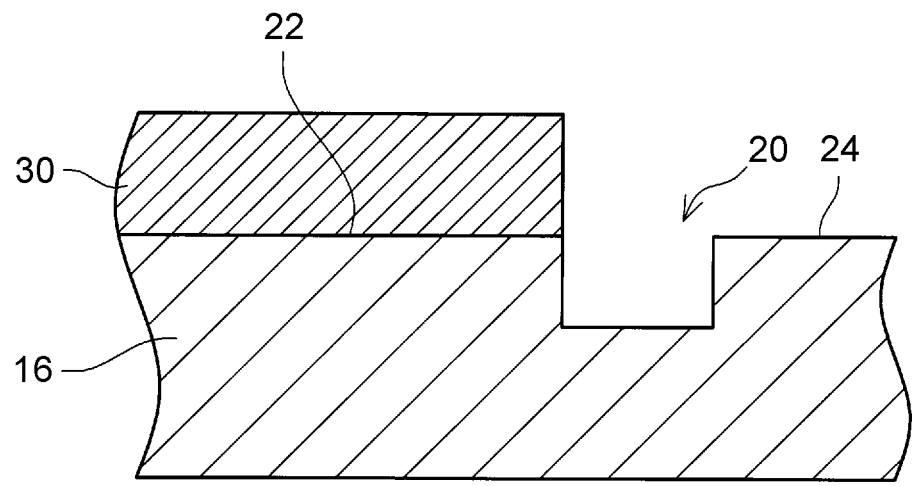
FIG. 4 is a view illustrating a manufacturing process of the semiconductor device 10 (enlarged sectional view around a recess 20)

Next, a manufacturing method of the semiconductor device 10 will be described. First, as shown in FIG. 4, a conductive paste 30 is applied to the central part 22 of the upper surface of the electrode plate 16. The conductive paste 30 is a paste containing a solvent and metal particles diffused in the solvent. Here, the conductive paste 30 is applied over the entire area of the central part 22. The conductive paste 30 is not applied to the recess 20 and the outer peripheral part 24.

Figure 5:
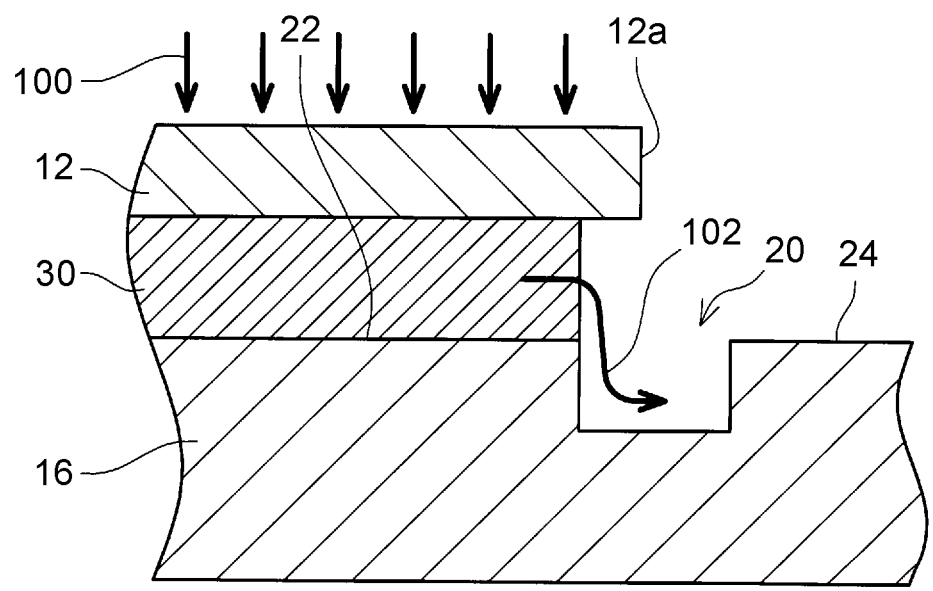
FIG. 5 is a view illustrating the manufacturing process of the semiconductor device 10 (enlarged sectional view around the recess 20)

Next, as shown in FIG. 5, the semiconductor chip 12 is placed on the conductive paste 30. Here, the semiconductor chip 12 is placed so that the entire upper side of the central part 22 is covered with the semiconductor chip 12, and that the outer peripheral edge 12a of the semiconductor chip 12 is located above the recess 20.

Figure 6:
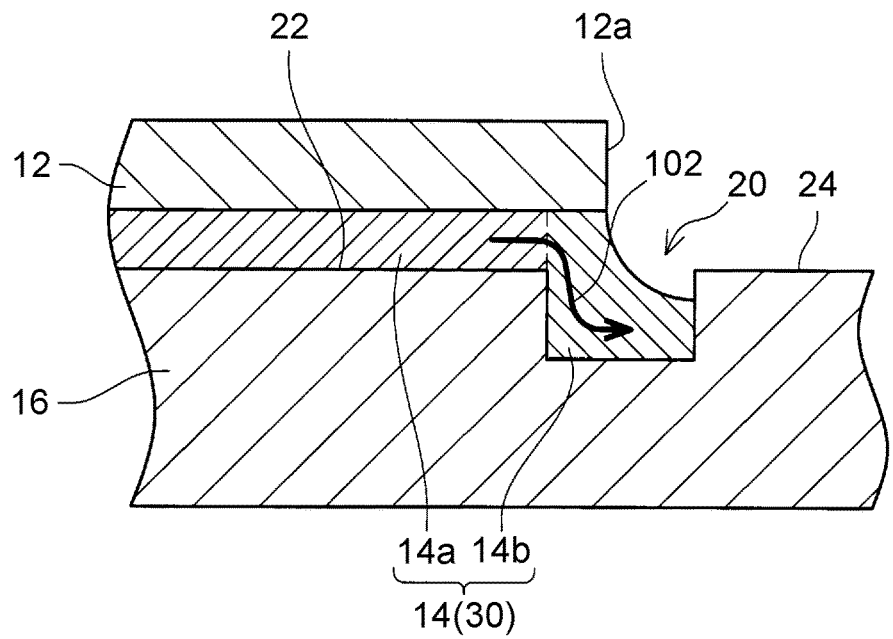
FIG. 6 is a view illustrating the manufacturing process of the semiconductor device 10 (enlarged sectional view around the recess 20)

Next, the stack of the electrode plate 16, the conductive paste 30, and the semiconductor chip 12 is heated while pressure is applied to the semiconductor chip 12 in a direction toward the electrode plate 16 as indicated by arrows 100 in FIG. 5. Pressure is applied to the conductive paste 30 as pressure is thus applied to the semiconductor chip 12 in the direction toward the electrode plate 16. As a result, the conductive paste 30 flows from a position between the semiconductor chip 12 and the central part 22 to an outer side as indicated by an arrow 102 in FIG. 5. The conductive paste 30 having flowed out flows into the recess 20. Thus, as shown in FIG. 6, an inner surface of the recess 20 is covered with the conductive paste 30. In other words, the conductive paste 30 comes in contact with the bottom surface and a side surface of the recess 20. Although the conductive paste 30 is in contact with the side surface of the recess 20 on the side of the outer peripheral part 24 in FIG. 6, the conductive paste 30 does not need to be in contact with this side surface. As shown in FIG. 6, the conductive paste 30 having flowed out from the position between the semiconductor chip 12 and the central part 22 to the outer side comes in contact with a part of the lower surface of the semiconductor chip 12 that is located above the recess 20.

The heating volatilizes the solvent from the conductive paste 30. Moreover, as the conductive paste 30 is heated under pressure, the metal particles contained in the conductive paste 30 are joined with one another. Thus, as shown in FIG. 6, the conductive paste 30 forms the joining layer 14. Here, the conductive paste 30 located between the central part 22 and the semiconductor chip 12 is heated under high pressure, so that this part of the conductive paste 30 forms the low-porosity first part 14a. On the other hand, the conductive paste 30 located between the recess 20 and the semiconductor chip 12 is heated under relatively low pressure, so that this part of the conductive paste 30 forms the high-porosity second part 14b. The conductive paste 30 flows into the recess 20 as indicated by the arrow 102, so that the surface of the joining layer 14 exposed between the semiconductor chip 12 and the electrode plate 16 assumes a shape that is inclined so as to shift toward the bottom surface of the recess 20 while extending from the outer peripheral edge 12a of the semiconductor chip 12 toward the outer peripheral part 24.

Thereafter, when the stack of the electrode plate 16, the conductive paste 30, and the semiconductor chip 12 are cooled to room temperature, each of the electrode plate 16, the conductive paste 30, and the semiconductor chip 12 shrinks. The amount of shrinkage varies among the electrode plate 16, the joining layer 14, and the semiconductor chip 12 due to the difference in the coefficient of linear expansion. Accordingly, thermal stress acts on the semiconductor chip 12. Higher thermal stress is likely to occur in the outer peripheral part (i.e., the part in the vicinity of the outer peripheral edge 12a) of the semiconductor chip 12 than in the central part of the semiconductor chip 12. In this manufacturing method, however, the high-porosity second part 14b of the joining layer 14 is joined to the outer peripheral part of the semiconductor chip 12. Having a high porosity, the second part 14b is likely to undergo elastic deformation. Elastic deformation of the second part 14b relieves the thermal stress acting on the outer peripheral part of the semiconductor chip 12. Thus, according to this manufacturing method, the reliability of the semiconductor chip 12 can be improved. Moreover, the central part of the semiconductor chip 12 in which high thermal stress is likely to occur is firmly joined to the electrode plate 16 by the first part 14a of the joining layer 14. Thus, sufficiently high joint strength can be secured between the semiconductor chip 12 and the electrode plate 16.

Figure 7:
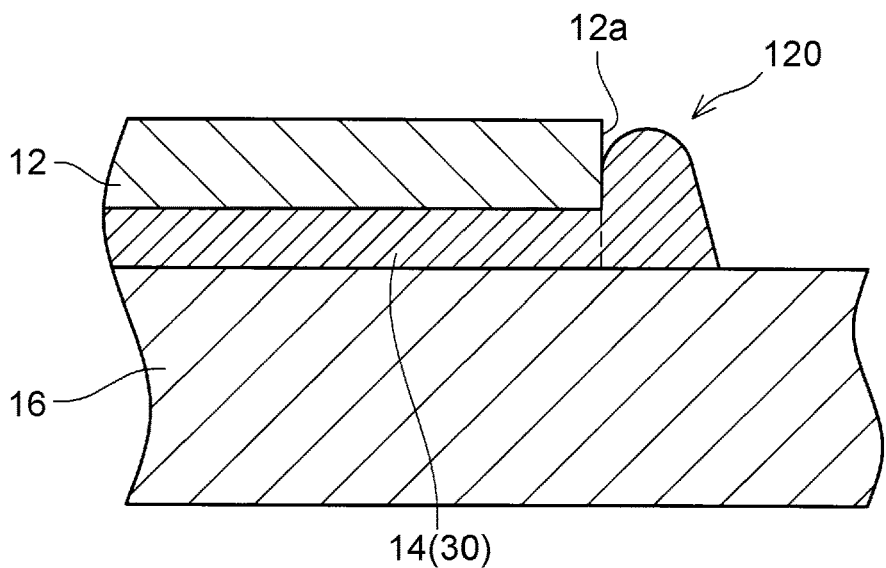
FIG. 7 is a view illustrating a manufacturing process in a comparative example.

FIG. 7 shows a case where the electrode plate 16 and the semiconductor chip 12 are joined through the joining layer 14 (i.e., the conductive paste 30) when the upper surface of the electrode plate 16 is flat (i.e., the recess 20 is not provided). When the upper surface of the electrode plate 16 is flat, the conductive paste 30 having flowed under pressure from the area between the semiconductor chip 12 and the electrode plate 16 to the outer side swells upward at a position adjacent to the outer peripheral edge 12a of the semiconductor chip 12, and thereby forms a protrusion 120. The protrusion 120 may come in contact with the outer peripheral edge 12a of the semiconductor chip 12, which may result in short-circuit of elements inside the semiconductor chip 12. Moreover, when the protrusion 120 is formed, cracks are likely to occur in the protrusion 120 due to stress. If a crack having occurred in the protrusion 120 grows to a region between the semiconductor chip 12 and the electrode plate 16, for example, the electric resistance of the joining layer 14 rises. By contrast, in the semiconductor device 10 manufactured by the above manufacturing method, the surface of the joining layer 14 has a shape that is inclined so as to shift toward the bottom surface of the recess 20 while extending from the outer peripheral edge 12a of the semiconductor chip 12 toward the outer peripheral part 24. The joining layer 14 having this shape can be kept from coming in contact with the outer peripheral edge 12a of the semiconductor chip 12. Thus, short-circuit of the elements inside the semiconductor chip 12 can be avoided. Moreover, cracks are less likely to occur in the joining layer 14 having this shape, so that the rise of the electric resistance of the joining layer 14 can be avoided.

A technique of connecting a semiconductor chip to an electrode plate using solder is commonly known. This technique sometimes involves forming a recess in a surface of an electrode plate to keep solder from excessively wetting and spreading over the surface of the electrode plate. Such a recess is typically provided further on an outer side than an outer peripheral edge of the semiconductor chip. By contrast, the recess for the conductive paste disclosed by the present specification is used so that the outer peripheral edge of the semiconductor chip is located above this recess. Thus using the recess can enlarge the area of the conductive paste by allowing the conductive paste to flow into the recess. The recess disclosed by the present specification secondarily also has the function of keeping the conductive paste from spreading from the specified area to the outer side beyond the recess.

Figure 8:
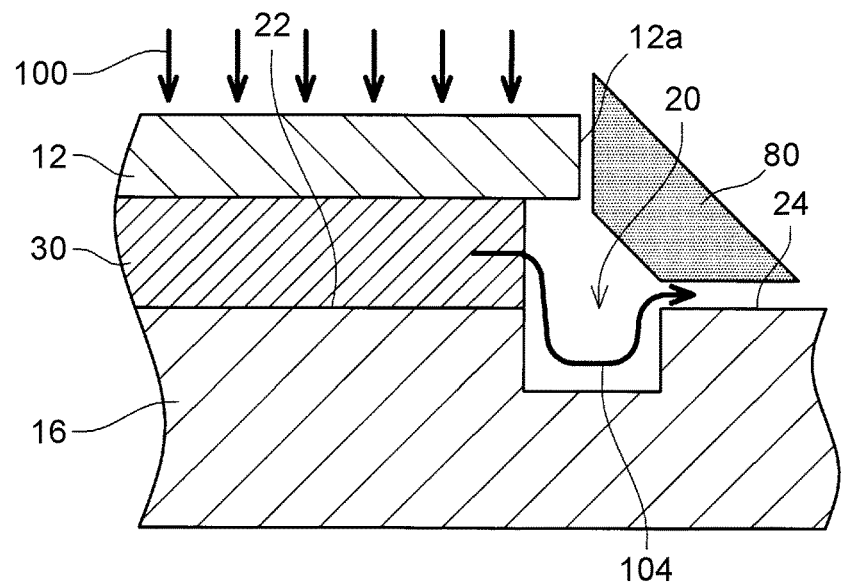
FIG. 8 is a view illustrating a manufacturing process in a modified example (enlarged sectional view around the recess 20)
Figure 9:
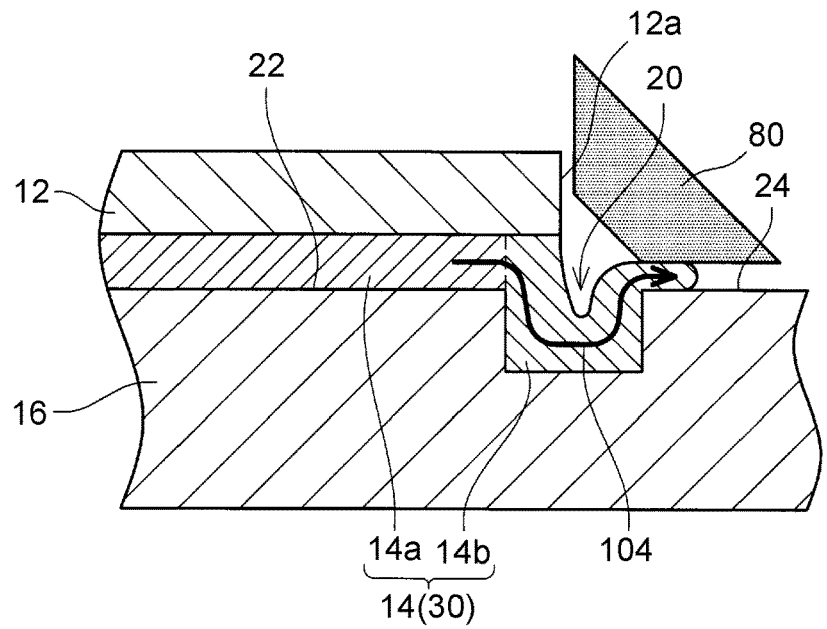
FIG. 9 is a view illustrating the manufacturing process in the modified example (enlarged sectional view around the recess 20).

In the above manufacturing method, the amount of the conductive paste 30 flowing into the recess 20 may become excessively large due to manufacturing variation. If such a phenomenon tends to occur, a jig 80 may be installed above the recess 20 in the step of hardening the conductive paste 30 as shown in FIGS. 8 and 9. The jig 80 is disposed close to the outer peripheral edge 12a of the semiconductor chip 12, and keeps the conductive paste 30 from swelling upward. A clearance is left between the jig 80 and the outer peripheral part 24 of the electrode plate 16 to allow the conductive paste 30 to flow toward the outer peripheral part 24. When a large amount of the conductive paste 30 flows into the recess 20, the conductive paste 30 flows from the recess 20 to an upper side of the outer peripheral part 24 as indicated by an arrow 104 in FIGS. 8 and 9. Thus, the conductive paste 30 is kept from swelling upward in the recess 20. Accordingly, in this case, too, the surface of the part of the joining layer 14 that is adjacent to the outer peripheral edge 12a of the semiconductor chip 12 assumes a shape shifting toward the bottom surface of the recess 20 while extending toward the outer peripheral part 24. It is therefore possible to keep the joining layer 14 from coming in contact with the outer peripheral edge 12a, as well as to avoid cracks occurring in the joining layer 14.

What is claimed is:

1. A semiconductor device comprising:
   an electrode plate including a recess and a specified area adjacent to the recess, the recess being in a surface of the electrode plate;
   a joining layer that is composed of metal and that covers an area extending from the specified area to the recess; and
   a semiconductor chip being disposed so as to face the specified area and the recess, the semiconductor chip being joined to the joining layer above the specified area and the recess, and an outer peripheral edge of the semiconductor chip being located above the recess, wherein
   a porosity of the joining layer in the recess is higher than a porosity of the joining layer in the specified area.

2. The semiconductor device according to claim 1, wherein a surface of a part of the joining layer that is adjacent to the outer peripheral edge of the semiconductor chip is inclined relative to a lower surface of the semiconductor chip so as to shift toward a bottom surface of the recess while extending away from the specified area.

3. The semiconductor device according to claim 1, wherein the joining layer is a conductive paste.

4. The semiconductor device according to claim 1, wherein
   the recess extends in an annular shape in the surface of the electrode plate so as to surround the semiconductor chip, and
   the specified area is an area surrounded by the recess.

* * * * *